United States Patent
Akahori et al.

(10) Patent No.: US 10,374,469 B2
(45) Date of Patent: Aug. 6, 2019

(54) WIRELESS POWER RECEIVER, WIRELESS POWER SUPPLY SYSTEM, AND WIRELESS POWER RECEPTION METHOD

(71) Applicant: LAPIS SEMICONDUCTOR CO., LTD., Kanagawa (JP)

(72) Inventors: Hiroji Akahori, Kanagawa (JP); Takashi Taya, Kanagawa (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 112 days.

(21) Appl. No.: 15/717,817

(22) Filed: Sep. 27, 2017

(65) Prior Publication Data

US 2018/0091003 A1 Mar. 29, 2018

(30) Foreign Application Priority Data

Sep. 29, 2016 (JP) ................. 2016-191654

(51) Int. Cl.
*H02J 50/80* (2016.01)
*H02J 50/10* (2016.01)
*G11C 16/34* (2006.01)
*G11C 5/14* (2006.01)
*G11C 16/10* (2006.01)
(Continued)

(52) U.S. Cl.
CPC ............. *H02J 50/80* (2016.02); *G11C 5/142* (2013.01); *G11C 16/10* (2013.01); *G11C 16/102* (2013.01); *G11C 16/225* (2013.01); *G11C 16/30* (2013.01); *G11C 16/3459* (2013.01); *G11C 17/16* (2013.01); *G11C 17/18* (2013.01); *G11C 29/027* (2013.01); *H02J 50/10* (2016.02); *G11C 2029/0407* (2013.01); *G11C 2029/4402* (2013.01)

(58) Field of Classification Search
CPC .......... H02J 50/80; H02J 50/10; G11C 5/142; G11C 16/10; G11C 16/102; G11C 16/225; G11C 16/30; G11C 16/3459; G11C 17/16; G11C 17/18; G11C 29/027; G11C 2029/0407; G11C 2029/4402
USPC .......................................... 307/104
See application file for complete search history.

(56) References Cited

U.S. PATENT DOCUMENTS 6,321,067 B1 * 11/2001 Suga .................... G06K 7/0008
455/41.2

FOREIGN PATENT DOCUMENTS

JP    2001286080 A    10/2001

* cited by examiner

*Primary Examiner* — Carlos Amaya
(74) *Attorney, Agent, or Firm* — Volentine, Whitt & Francos, PLLC

(57) ABSTRACT

The present disclosure provides a wireless power receiver including: a power receiver configured to receive electrical power that is wirelessly transmitted from a wireless power transmitter; a power reception-side communication section configured to wirelessly communicate with the wireless power transmitter; a storage section to which data received by the power reception-side communication section is written by using the electrical power received by the power transmitter; and a monitoring section configured to monitor the electrical power or a voltage that corresponds to the electrical power supplied to the storage section in a case in which the data is being written to the storage section, the monitoring section transmits write information, which indicates whether or not the data was correctly written to the storage section based on a monitoring result, from the power reception-side communication section to the wireless power transmitter information.

6 Claims, 6 Drawing Sheets

(51) Int. Cl.
*G11C 16/22* (2006.01)
*G11C 16/30* (2006.01)
*G11C 17/16* (2006.01)
*G11C 17/18* (2006.01)
*G11C 29/02* (2006.01)
G11C 29/04 (2006.01)
G11C 29/44 (2006.01)

WIRELESS POWER RECEIVER, WIRELESS POWER SUPPLY SYSTEM, AND WIRELESS POWER RECEPTION METHOD

CROSS-REFERENCE TO RELATED APPLICATION

This application claims priority under 35 USC 119 from Japanese Patent Application No. 2016-191654, filed on Sep. 29, 2016, the disclosure of which is incorporated by reference herein.

BACKGROUND

Technical Field

The present disclosure relates to a wireless power receiver, a wireless power supply system, and a wireless power reception method.

Related Art

Hitherto, a wireless power supply system has been known in which electrical power is wirelessly transmitted from a wireless power transmitter to a wireless power receiver without contact (wirelessly), and the electrical power received by the wireless power receiver is supplied to a battery or the like. Further, as the wireless power supply system, technology is known that performs data communication between the wireless power transmitter and the wireless power receiver using short range wireless communication.

In such a wireless power supply system, a wireless power receiver is known in which a storage section is provided, the storage section is supplied with electrical power received from the wireless power transmitter, and written with data using the supplied electrical power.

In the wireless power receiver, in a case in which the supplied electrical power is low, data may not be correctly written in the storage section or the written data may not be held for a long period of time. Thus, for example, Japanese Patent Application Laid-Open (JP-A) No. 2001-286080 discloses a technology that forbids writing to the storage section in a case in which the voltage employed for writing is not sufficiently high.

In a case in which data transmitted from a wireless power transmitter is written to a storage section of a wireless power receiver, it is desirable for the wireless power transmitter to ascertain the result of writing data to the storage section. However, in the technology described in JP-A No. 2001-286080, there may be, for example, cases in which the wireless power transmitter cannot sufficiently ascertain the result of writing to the storage section. Namely, in the technology described in JP-A No. 2001-286080, there may be, for example, cases in which the wireless power transmitter cannot sufficiently ascertain whether or not writing has been performed correctly after having written to the storage section. Thus, technology that may more accurately ascertain the result of writing data to the storage section has therefore been desired.

SUMMARY

The present disclosure provides a wireless power receiver, a wireless power supply system, and a wireless power reception method in which a wireless power transmitter may more accurately ascertain a result of writing data to a storage section.

A first aspect of the present disclosure is a wireless power receiver including: a power receiver configured to receive electrical power that is wirelessly transmitted from a wireless power transmitter; a power reception-side communication section configured to wirelessly communicate with the wireless power transmitter; a storage section to which data received by the power reception-side communication section is written by using the electrical power received by the power transmitter; and a monitoring section configured to monitor the electrical power or a voltage that corresponds to the electrical power supplied to the storage section in a case in which the data is being written to the storage section, the monitoring section transmits write information, which indicates whether or not the data was correctly written to the storage section based on a monitoring result, from the power reception-side communication section to the wireless power transmitter information.

A second aspect of the present disclosure is a wireless power supply system including a wireless power transmitter and a wireless power receiver, wherein: the wireless power receiver includes a power receiver configured to receive electrical power that is wirelessly transmitted from a wireless power transmitter, a power reception-side communication section configured to wirelessly communicate with the wireless power transmitter, a storage section to which data received by the power reception-side communication section is written by using the electrical power received by the power transmitter, and a monitoring section configured to monitor the electrical power or a voltage that corresponds to the electrical power supplied to the storage section in a case in which the data is being written to the storage section, to store, in the storage section, a combination of a monitoring result and predetermined information, as monitoring information, and to transmit the monitoring information that has been read from the storage section to the wireless power transmitter from the power reception-side communication section; and the wireless power transmitter includes a power transmission section configured to wirelessly transmit electrical power to the wireless power receiver, a transmission-side communication section configured to wirelessly perform communication with the wireless power receiver, and a controller configured to control transmission of the data from the transmission-side communication section, and to determine whether or not the data is correctly written to the storage section based on the monitoring result obtained from the monitoring information received by the transmission-side communication section.

A third aspect of the present disclosure is a wireless power reception method including: wirelessly receiving electrical power transmitted from a wireless power transmitter; performing wireless communication with the wireless power transmitter; writing received data to a storage section using the received electrical power; monitoring electrical power or a voltage that corresponds to the electrical power supplied to the storage section in a case in which the received data is being written to the storage section; and transmitting a monitoring result to the wireless power transmitter.

According to the above aspects of the present disclosure, the result of writing data to the storage section may be more accurately ascertained by the wireless power transmitter.

BRIEF DESCRIPTION OF THE DRAWINGS

Exemplary embodiments will be described in detail based on the following figures, wherein.

DETAILED DESCRIPTION

Detailed description of exemplary embodiments is given below, with reference to the drawings.

Figure 1:
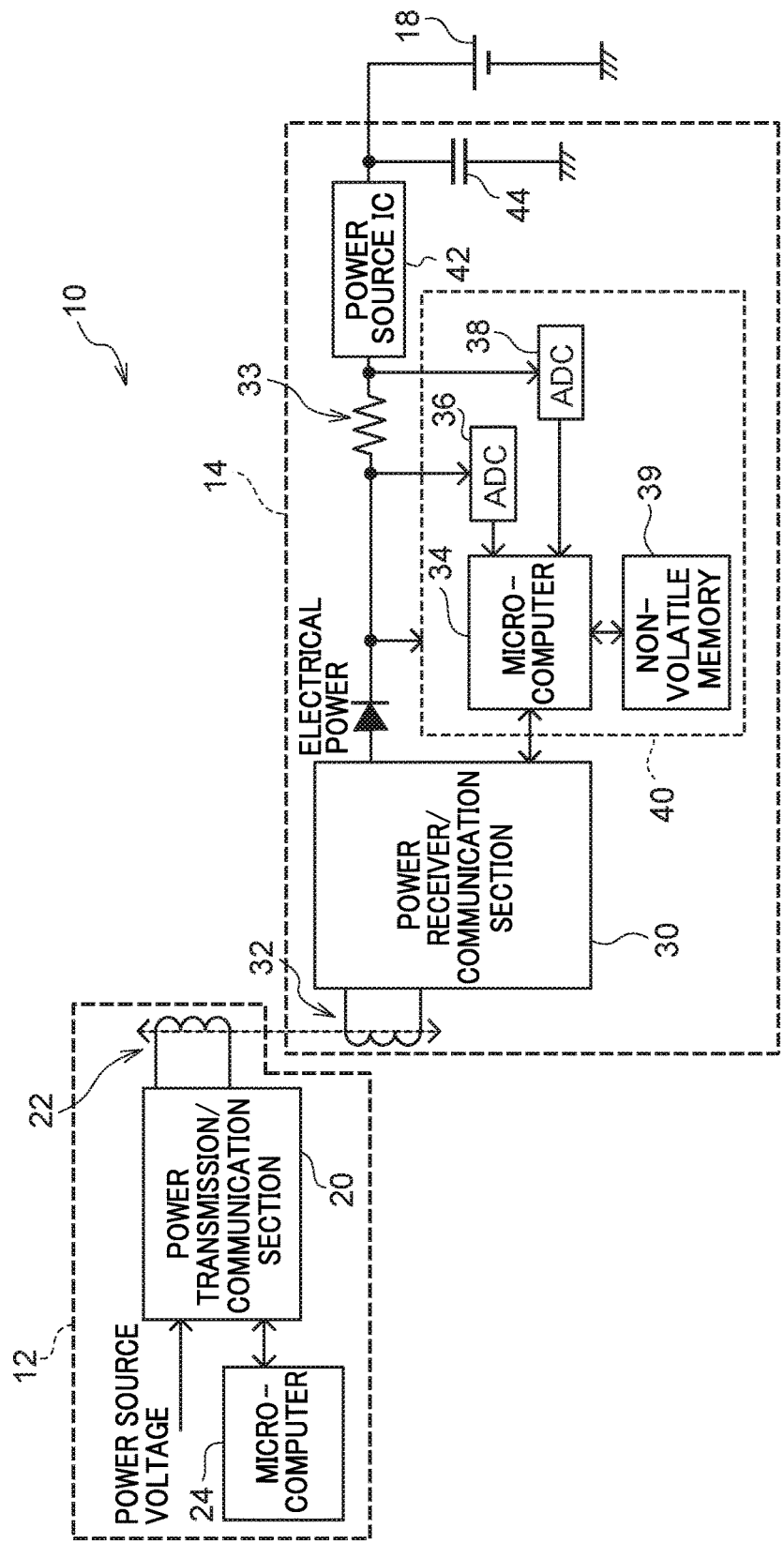
FIG. 1 is a diagram illustrating a schematic configuration of a wireless power supply system of an exemplary embodiment.

First, configuration of a wireless power supply system of an exemplary embodiment is described. FIG. 1 is a diagram illustrating a schematic configuration of an example of a wireless power supply system 10 of the present exemplary embodiment.

As illustrated in FIG. 1, the wireless power supply system 10 of the present exemplary embodiment includes a wireless power transmitter 12 that includes a coil antenna 22, and a wireless power receiver 14 that includes a coil antenna 32.

In the wireless power supply system 10 of the present exemplary embodiment, power supply is performed wirelessly from the wireless power transmitter 12 to the wireless power receiver 14 without contact (wirelessly). In the wireless power supply system 10 of the present exemplary embodiment, a case will be described in which an electromagnetic induction method is employed as an example of wireless power supply. In the wireless power supply system 10 of the present exemplary embodiment, to supply power, the wireless power transmitter 12 generates magnetic flux by passing an alternating current (AC) through the coil antenna 22. As a result, magnetic flux through the coil antenna 32 of the wireless power receiver 14 changes and alternating current also flows through the coil antenna 32.

Further, the wireless power supply system 10 of the present exemplary embodiment performs data communication between the wireless power transmitter 12 and the wireless power receiver 14, using short range wireless communication. An example of short range wireless communication performed by the wireless power supply system 10 is short range wireless communication or the like that uses, for example, near field communication (NFC). The coil antenna 22 of the wireless power transmitter 12 and the coil antenna 32 of the wireless power receiver 14 have both the functionality of an antenna used in wireless communication and an antenna used in wireless power supply. The wireless power transmitter 12 and the wireless power receiver 14 are configured so as to be able to switch between power supply and information communication by the coil antenna 22 and the coil antenna 32.

The wireless power transmitter 12 includes a power transmission and communication section (hereafter referred to as the power transmission/communication section) 20, the coil antenna 22, and a microcomputer 24.

The microcomputer 24 performs control related to electrical power transmission and communication by the power transmission/communication section 20. Further, the microcomputer 24 of the present exemplary embodiment performs control related to writing data to non-volatile memory 39 (described in detail later) of the wireless power receiver 14. The microcomputer 24 of the present exemplary embodiment is an example of a controller of the present disclosure.

A power source voltage is input to the power transmission/communication section 20 and electrical power is transmitted (supplied) by passing an alternating current through the coil antenna 22 in accordance with control by the microcomputer 24. Further, as described above, the power transmission/communication section 20 of the present exemplary embodiment performs wireless communication using the coil antenna 22 in accordance with control by the microcomputer 24. The power transmission/communication section 20 of the present exemplary embodiment is an example of a power transmission section and a power transmission-side communication section of the present disclosure.

On the other hand, the wireless power receiver 14 includes a power receiver/communication section 30, a coil antenna 32, a resistor element 33, a monitoring section 40, a power source integrated circuit (IC) 42, and a smoothing capacitor 44. Further, the monitoring section 40 includes a microcomputer 34, an analog-to-digital converter (ADC) 36, an ADC 38, and the non-volatile memory 39. The monitoring section 40 employs, as power source for functioning, electrical power supplied from the power receiver/communication section 30.

The microcomputer 34 performs control related to reception of electrical power and communication by the power receiver/communication section 30. Further, the microcomputer 34 of the present exemplary embodiment controls operation of the monitoring section 40, and monitors writing of data received from the wireless power transmitter 12 to the non-volatile memory 39.

The power receiver/communication section 30 receives electrical power transmitted (supplied) from the wireless power transmitter 12 as a result of induced electromotive force causing the magnetic flux density through the coil antenna 32 to change and an alternating current to flow through the coil antenna 32. Further, as described above, the power receiver/communication section 30 of the present exemplary embodiment performs wireless communication using the coil antenna 32 in accordance with control by the microcomputer 34. The power receiver/communication section 30 of the present exemplary embodiment is an example of a power reception section and a power reception-side communication section of the present disclosure.

Electrical power received by the power receiver/communication section 30 is output to a battery 18 via the resistor element 33 and the power source IC 42. The battery 18 of the present exemplary embodiment is a secondary battery such as a lithium ion battery. Note that the battery 18 is not particularly limited as long as the battery 18 is chargable by the supplied electrical power.

The power source IC 42 transforms a voltage that has passed through the resistor element 33 into a charging voltage suitable for the battery 18. Further, the power source IC 42 transforms the output voltage output from the battery 18 into a voltage corresponding to the microcomputer 34 or the like. The smoothing capacitor 44 smooths the voltage output from the power source IC 42.

The ADC 36 of the present exemplary embodiment detects the voltage before passing through the resistor element 33. On the other hand, the ADC 38 detects the voltage after passing through the resistor element 33. The voltages detected by the ADC 36 and the ADC 38 are output to the microcomputer 34. Note that, in the present exemplary embodiment, in a case in which electrical power is being received by the wireless power receiver 14, the voltage output from the ADC 36 to the microcomputer 34 is referred to as a first voltage, and the voltage output from the ADC 38 to the microcomputer 34 is referred to as a second voltage. Since a voltage drop occurs when the current passes through the resistor element 33, the microcomputer 34 can derive the current value flowing through the resistor element 33 based on the voltage detected by the ADC 36 and the voltage detected by the ADC 38. Thus, the microcomputer 34 can derive the received (supplied) electrical power.

The non-volatile memory 39 is a storage section to which data transmitted from the wireless power transmitter 12 and received by the power receiver/communication section 30 is written. The non-volatile memory 39 is, for example, flash memory or the like. The non-volatile memory 39 is an example of a storage section of the present disclosure.

In the wireless power supply system 10, an example of the data transmitted from the wireless power transmitter 12 and written to the non-volatile memory 39 is a unique identification (ID) or the like.

Next, operation of the wireless power supply system 10 of the present exemplary embodiment in a case in which data transmitted from the wireless power transmitter 12 is written to the non-volatile memory 39 of the wireless power receiver 14, will be described.

Figure 2:
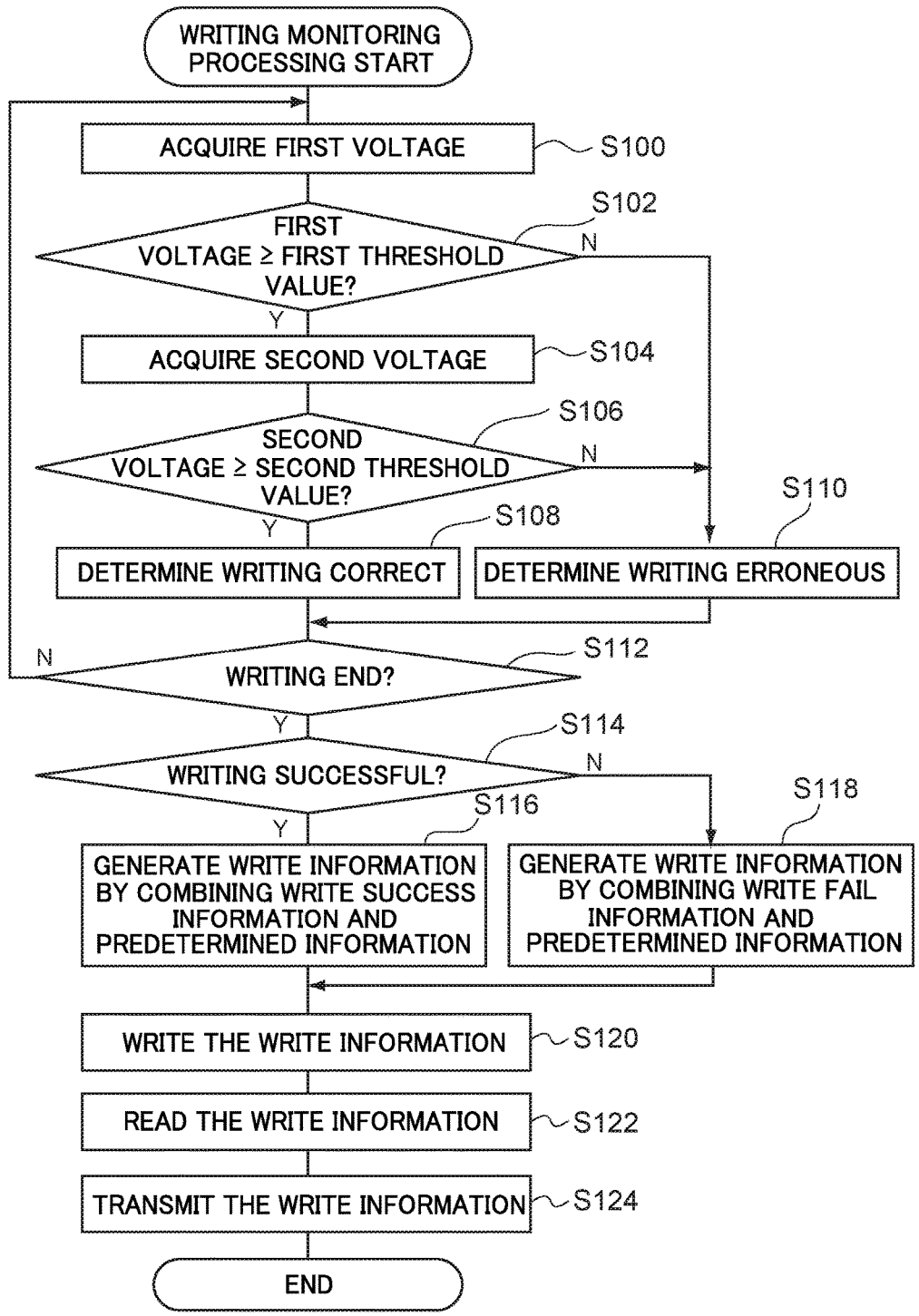
FIG. 2 is a flowchart illustrating an example of writing monitoring processing executed by a wireless power receiver of an exemplary embodiment.

In the wireless power receiver 14, data received from the wireless power transmitter 12 by the power receiver/communication section 30 is written to the non-volatile memory 39. In a case in which data writing starts, the microcomputer 34 executes the writing monitoring processing, illustrated as an example in FIG. 2.

At step S100, the microcomputer 34 acquires the first voltage from the ADC 36.

At the next step S102, the microcomputer 34 determines whether or not the first voltage is a first threshold value or greater (first voltage≥first threshold value). The first threshold value of the present exemplary embodiment is a voltage predetermined based on a voltage needed when writing data to the non-volatile memory 39 and a voltage that enables written data to be held by the non-volatile memory 39 for a predetermined period of time or longer. Note that the voltage needed when writing data to the non-volatile memory 39, and the voltage that enables written data to be held by the non-volatile memory 39 for the predetermined period of time or longer may, for example, be obtained by experiment. In a case in which the first voltage is less than the first threshold value, a negative determination is made in step S102, and processing proceeds to step S110.

On the other hand, in a case in which the first voltage is the first threshold value or greater, an affirmative determination is made in step S102 and processing proceeds to step S104.

At step S104, the microcomputer 34 acquires the second voltage from the ADC 38.

At the next step S106, the microcomputer 34 determines whether or not the second voltage is a second threshold value or greater (second voltage≥second threshold value). The second threshold value of the present exemplary embodiment is a voltage predetermined based on a voltage needed when writing data to the non-volatile memory 39, and is a voltage that enables written data to be held by the non-volatile memory 39 for the predetermined period of time or greater. Note that since a voltage drop occurs due to the resistor element 33, the first threshold value is greater than the second threshold value.

In a case in which the second voltage is less than the second threshold value, a negative determination is made in step S106, and processing proceeds to step S110. At step S110, the microcomputer 34 determines that there has been a write error and information indicating the determination result is temporarily written to a storage section (not illustrated in the drawings), different from the non-volatile memory 39, and processing then proceeds to step S112.

On the other hand, in a case in which the second voltage is the second threshold value or greater, an affirmative determination is made in step S106, and processing proceeds to step S108. At step S108, the microcomputer 34 determines that writing was performed correctly, and information indicating the determination result is temporarily written to the storage section (not illustrated in the drawings), different from the non-volatile memory 39, and processing then proceeds to step S112.

At step S112, the microcomputer 34 determines whether or not writing of data to the non-volatile memory 39 has completed. In cases in which writing has not yet completed, a negative determination is made in step S112 and the processing returns to step S100, and the above-described processing to determine whether or not writing was performed correctly is repeated. On the other hand, in cases in which writing has completed, an affirmative determination is made in step S112 and processing proceeds to step S114.

At step S114, the microcomputer 34 determines whether or not writing was successful, based on the information representing the determination result temporarily written in the storage section by the processing of step S108 or step S110 above. However, the method for the microcomputer 34 to determine whether or not writing is successful is not particularly limited to the above. For example, a condition for determining that the writing has failed may be set beforehand, and the writing may be determined failed in a case in which the condition is met, or the writing may be determined successful in a case in which the condition is not met. In the above case, the condition for determining that the writing has failed may be set such that, for example, in a case in which there has been one or more determination result indicating that there was a writing error. Further, the condition for determining that writing has failed may be set such that, for example, in a case in which there were a predetermined number or greater of determination results indicating that there was writing error, or in a case in which determination results indicating that there was writing error among all of the determination results is equal to or greater than a predetermined ratio.

Note that, in the present exemplary embodiment, in a case in which the determination in step S114 has completed, the microcomputer 34 erases the determination result that was temporarily stored in the storage section.

In cases in which it has been determined that writing was successful, an affirmative determination is made in step S114, and processing proceeds to step S116.

At step S116, the microcomputer 34 generates write information that is a combination of write success information indicating that writing was successful and predetermined information, and processing then proceeds to step S120. The predetermined information is not particularly limited, and is information shared in advance by both the wireless power transmitter 12 and the wireless power receiver 14. Information unique to communication in the wireless power supply system 10 is preferably employed as the predetermined information. Note that the method of combining the write success information and the predetermined information is not particularly limited. Combination may be performed by simply joining the write success information and the predetermined information into a single item of information, or may be performed by using a predetermined transformation method to transform a single item of information given by joining the write success information and the predetermined information together. However, it is preferable for the transformation result not to be a simple information having a lower number of bits or the like, than the write success information and write fail information.

On the other hand, in cases in which it has been determined that writing failed, a negative determination is made in step S114, and processing proceeds to step S118.

At step S118, the microcomputer 34 generates write information that is a combination of write fail information indicating that writing failed and predetermined information, and processing then proceeds to step S120. The predetermined information is not particularly limited, and is preferably the same information used in step S116 above. Further, the method of combining the write fail information and the predetermined information also not particularly limited, and is preferably the same method as that employed in step S116 above.

At step S120, the microcomputer 34 writes the write information generated at step S116 or step S118 to the non-volatile memory 39.

At the next step S122, the microcomputer 34 reads from the non-volatile memory 39 the write information written at step S120 above.

At the next step S124, the microcomputer 34 uses the power receiver/communication section 30 to transmit the write information, read at step S122 above, to the wireless power receiver 14, and the present writing monitoring processing ends.

Thus, the microcomputer 34 of the wireless power receiver 14 of the present exemplary embodiment monitors whether or not data was correctly (successfully) written to the non-volatile memory 39 by executing the writing monitoring processing.

Figure 3:
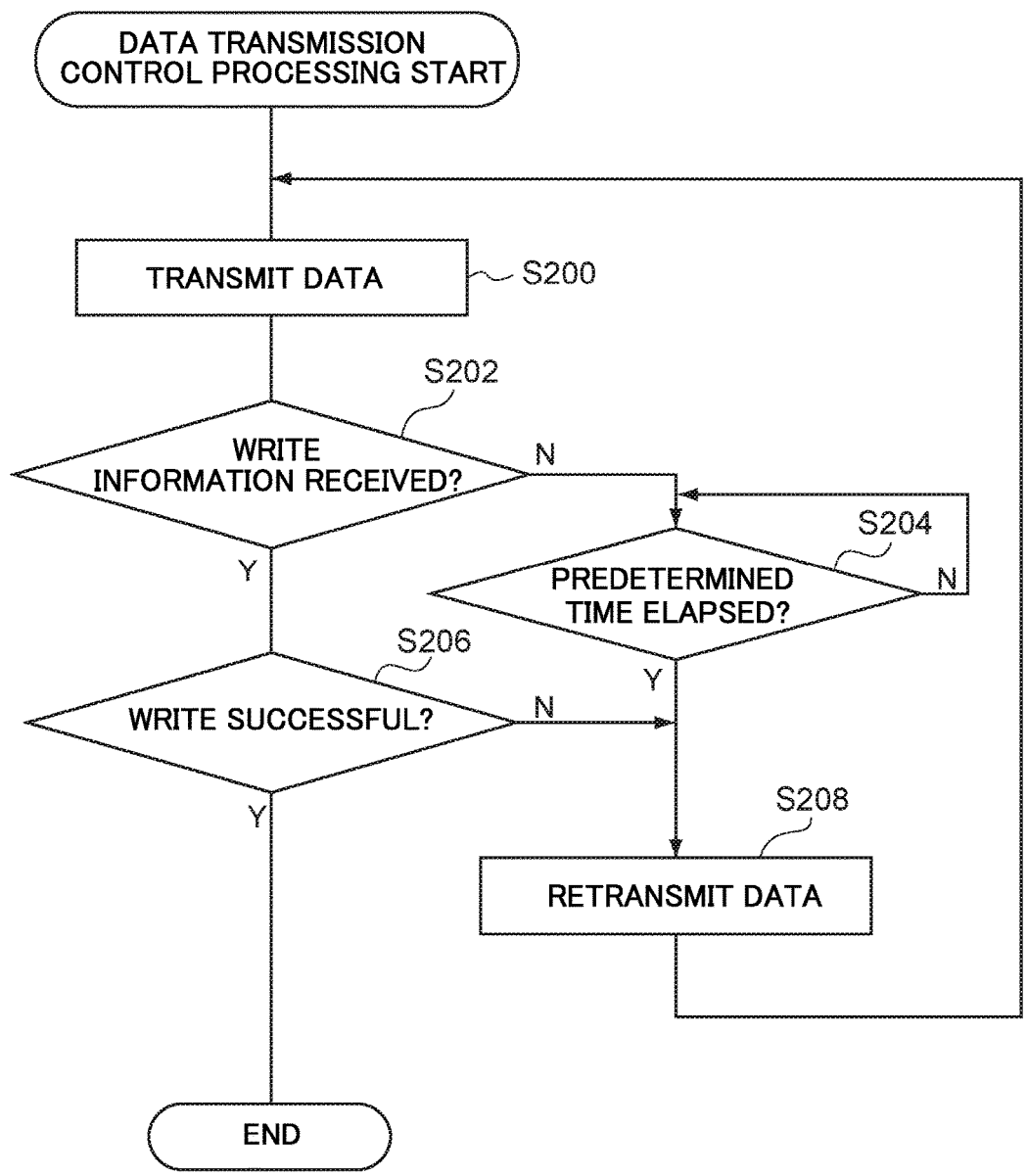
FIG. 3 is a flowchart illustrating an example of data transmission control processing executed by a wireless power transmitter of an exemplary embodiment.

On the other hand, in the wireless power transmitter 12 of the present exemplary embodiment, in order to transmit data to be written to the non-volatile memory 39 of the wireless power receiver 14, the microcomputer 24 executes the data transmission control processing illustrated as an example in FIG. 3.

At step S200, the microcomputer 24 uses the power transmission/communication section 20 to transmit data to be written to the wireless power receiver 14.

At the next step S202, the microcomputer 24 determines whether or not the write information transmitted from the wireless power receiver 14 at step S124 of the writing monitoring processing above (see FIG. 2) has been received. In cases in which the write information has not yet been received, a negative determination is made in step S202, and processing proceeds to step S204.

At step S204, the microcomputer 24 determines whether or not a predetermined time has elapsed since the data was transmitted. For example, in cases in which the positions of the wireless power transmitter 12 and the wireless power receiver 14 are too separated from each other, data transmitted by the wireless power transmitter 12 may not be received by the wireless power receiver 14, or write information may not be transmitted from the wireless power receiver 14. In consideration of such cases, in the wireless power transmitter 12 of the present exemplary embodiment, in cases in which write information has not been received during predetermined time from the start of transmission of data, it is determined in the wireless power receiver 14 that data was not correctly written (writing failed). Note that the predetermined time is not particularly limited here. Note that the predetermined time may, for example, be predetermined in accordance with the amount of data to be written.

In cases in which the predetermined time has not elapsed since the data was transmitted, a negative determination is made in step S204, and enters a standby state. On the other hand, in cases in which the predetermined time has elapsed since the data was transmitted, an affirmative determination is made in step S204, and processing proceeds to step S208.

At step S208, the microcomputer 24 uses the power transmission/communication section 20 to retransmit to the wireless power receiver 14 the same data as that transmitted at step S200 above, and processing then returns to step S200. Note that prior to re-transmitting the data, the microcomputer 24 may temporarily supply power to the wireless power receiver 14 in consideration that data might not be correctly written to the non-volatile memory 39 due to insufficient electrical power (voltage) in the wireless power receiver 14.

On the other hand, in cases in which the write information was received, an affirmative determination is made in step S202, and processing proceeds to step S206.

At step S206, the microcomputer 24 determines whether or not writing of data was successful based on the write information. In the present exemplary embodiment, as an example, the microcomputer 24 determines whether the write information is either information combining write success information and the predetermined information, or information combining write fail information and the predetermined information. Writing of data is then determined to have been successful in cases in which the write information is information combining write success information and predetermined information. On the other hand, writing of data is determined to have failed (not been successful) in cases in which the write information is information combining write fail information and the predetermined information.

In cases in which writing of data has not been successful, a negative determination is made in step S206, and processing proceeds to step S208, described above. On the other hand, in cases in which writing of data was successful, an affirmative determination is made in step S206, and the present data transmission control processing ends.

Note that in the data transmission control processing executed by the wireless power transmitter 12 of the present exemplary embodiment, retransmission of data is repeated until writing of the data is successful. However, the data transmission control processing may be ended in cases in which the number of times that the data has been transmitted (retransmitted) exceeds a predetermined number of times. In such cases, information indicating that writing of the data failed in the wireless power receiver 14 is preferably stored in the wireless power transmitter 12 or externally output.

As described above, the wireless power receiver 14 of the wireless power supply system 10 of the present exemplary embodiment includes: the power receiver/communication section 30 that receives electrical power wirelessly transmitted from the wireless power transmitter 12 and that wirelessly communicates with the wireless power transmitter 12; the non-volatile memory 39 that uses the electrical power received by the power receiver/communication section 30 to write data received by the power receiver/ communication section 30; and the monitoring section 40 that monitors the electrical power supplied to the non-volatile memory 39 or a voltage that corresponds to the electrical power, in a case in which the received data is written to the non-volatile memory 39, and that transmits, from the power receiver/communication section 30 to the wireless power transmitter 12, write information indicating whether or not the data was correctly written to the non-volatile memory 39 based on a monitoring result.

An example of the data to be written to the non-volatile memory 39 is ID information or the like unique to the wireless power supply system 10, as described above. As in the wireless power supply system 10 of the present exemplary embodiment, in cases in which the wireless power receiver 14 charges the battery 18 with electrical power transmitted from the wireless power transmitter 12, the wireless power receiver 14 still needs to be driven by the electrical power transmitted (supplied) from the wireless power transmitter 12, in cases in which the battery 18 is in an uncharged state. In order to perform power supply appropriately, the wireless power transmitter 12 and the wireless power receiver 14 need to be in appropriate combination. Namely, the wireless power transmitter 12 needs to be able to supply power to the wireless power receiver 14. Whether or not the combination is appropriate may, for example, be confirmed by exchanging the above unique ID information between the wireless power transmitter 12 and the wireless power receiver 14. Thus, although the unique ID information is stored in the wireless power receiver 14, the unique ID information needs to be overwritten in some cases.

Further, an example of the data to be written to the non-volatile memory 39 is information for expanding the functionality of the wireless power receiver 14 or the like.

It is important for the wireless power transmitter 12 to accurately ascertain whether or not this data was correctly written, since the data needs to be correctly written in the non-volatile memory 39 of the wireless power receiver 14.

In the wireless power receiver 14 of the present exemplary embodiment, the microcomputer 24 of the monitoring section 40 monitors the voltage supplied when data is being written to the non-volatile memory 39 and transmits to the wireless power transmitter 12, as write information, information indicating whether or not the data was correctly written to the non-volatile memory 39, based on the monitoring result.

Thus, according to the wireless power receiver 14 of the present exemplary embodiment, the wireless power transmitter 12 can more accurately ascertain the result of writing the data to the storage section.

Further, in the wireless power receiver 14 of the present exemplary embodiment, the microcomputer 34 temporarily writes the write information to the non-volatile memory 39 and transmits to the wireless power transmitter 12 write information that was read from the non-volatile memory 39.

In cases in which write success information or write fail information indicating whether or not writing was successful is simply employed as the write information, writing of the write information may fail due to this information being simplistic information, and the information read may become write success information even though write fail information should have been written. In such cases, the wireless power transmitter 12 may erroneously determine whether or not the data was correctly written.

In contrast thereto, in the present exemplary embodiment, the write information is information that combines write success information or write fail information with the predetermined information, rather than simply being write success information or write fail information. Accordingly, the possibility of erroneous detection as described above may be suppressed.

Figure 4:
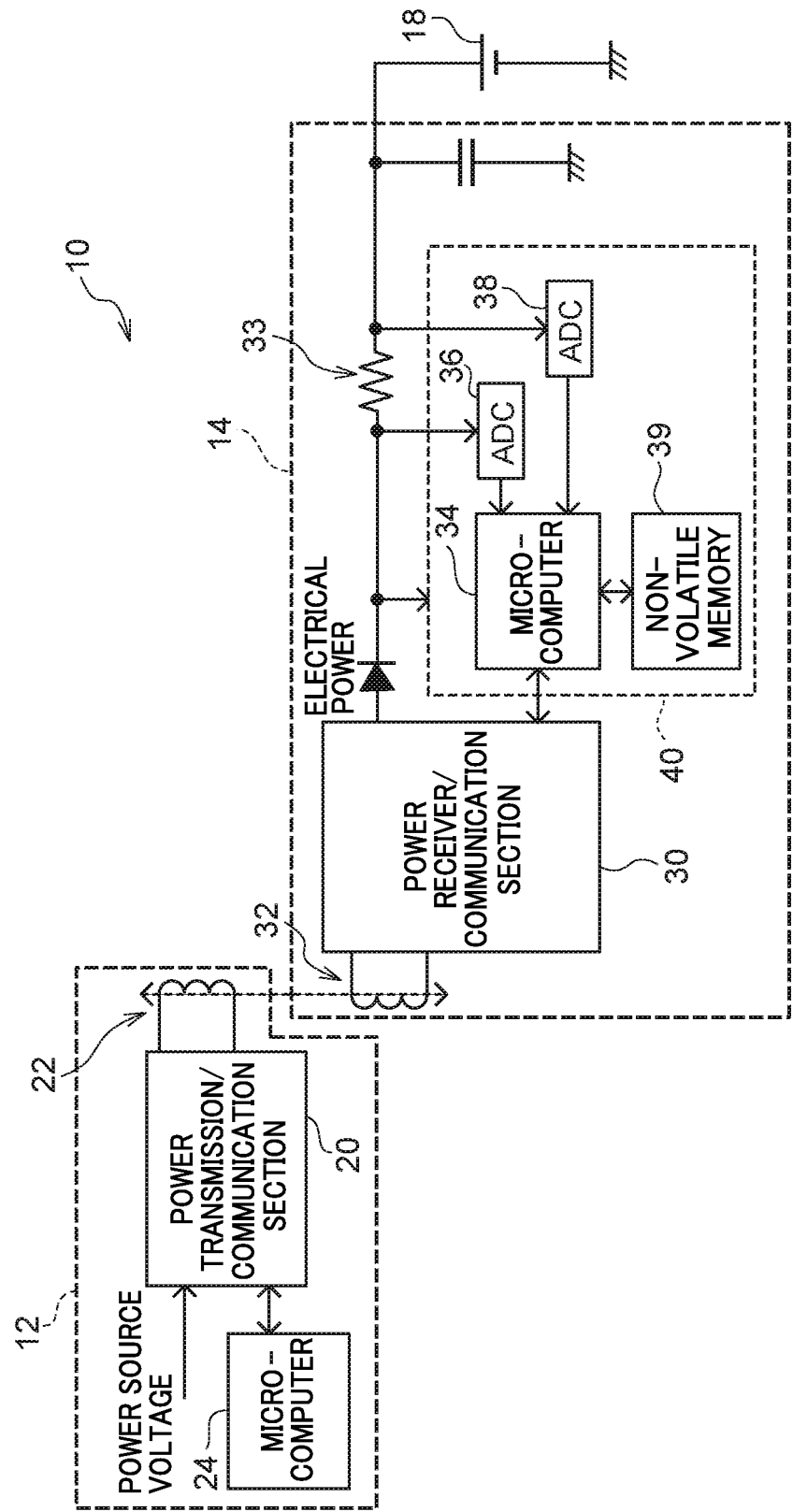
FIG. 4 is a diagram illustrating a schematic configuration of another example of a wireless power supply system of an exemplary embodiment.

Note that, the configuration of the wireless power receiver 14 is not limited to the example illustrated in FIG. 1. For example, as in the wireless power supply system 10 illustrated in FIG. 4, a configuration lacking the power source IC 42 may be employed. In such cases, the charging voltage of the battery 18 and the voltage supplied to the monitoring section 40 as the power source voltage become similar values. Note that in such cases, the functionality of the power source IC 42 needs, for example, to be incorporated in the microcomputer 34.

Figure 5:
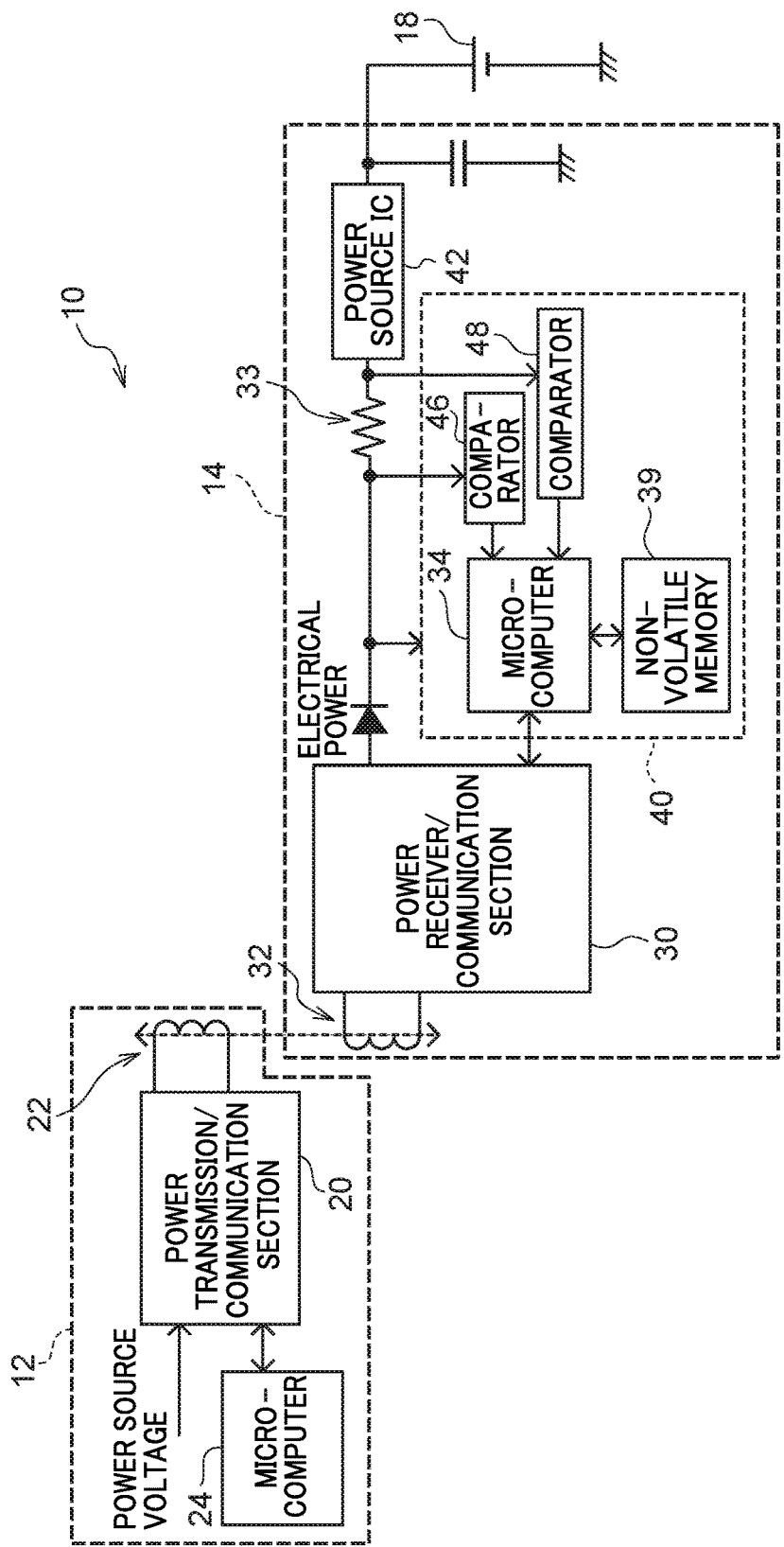
FIG. 5 is a diagram illustrating a schematic configuration of another example of a wireless power supply system of an exemplary embodiment.

Further, for example, the wireless power receiver 14 may have a configuration in which a comparator 46 and a comparator 48 are provided instead of the ADC 36 and the ADC 38, as in the example illustrated in FIG. 5. In such cases, the comparator 46 compares a voltage prior to passing through the resistor element 33 with the first threshold value, and in cases in which this voltage has fallen below the first threshold value, the comparator 46 outputs a signal to the microcomputer 34. Furthermore, in such cases, it is preferable for the comparator 46 to continue to hold this signal. On the other hand, the comparator 48 compares a voltage after passing through the resistor element 33 against the second threshold value, and in cases in which this voltage has fallen below the second threshold value, the comparator 48 outputs a signal to the microcomputer 34. Furthermore, in such cases, it is preferable for the comparator 48 to continue to hold this signal.

Figure 6:
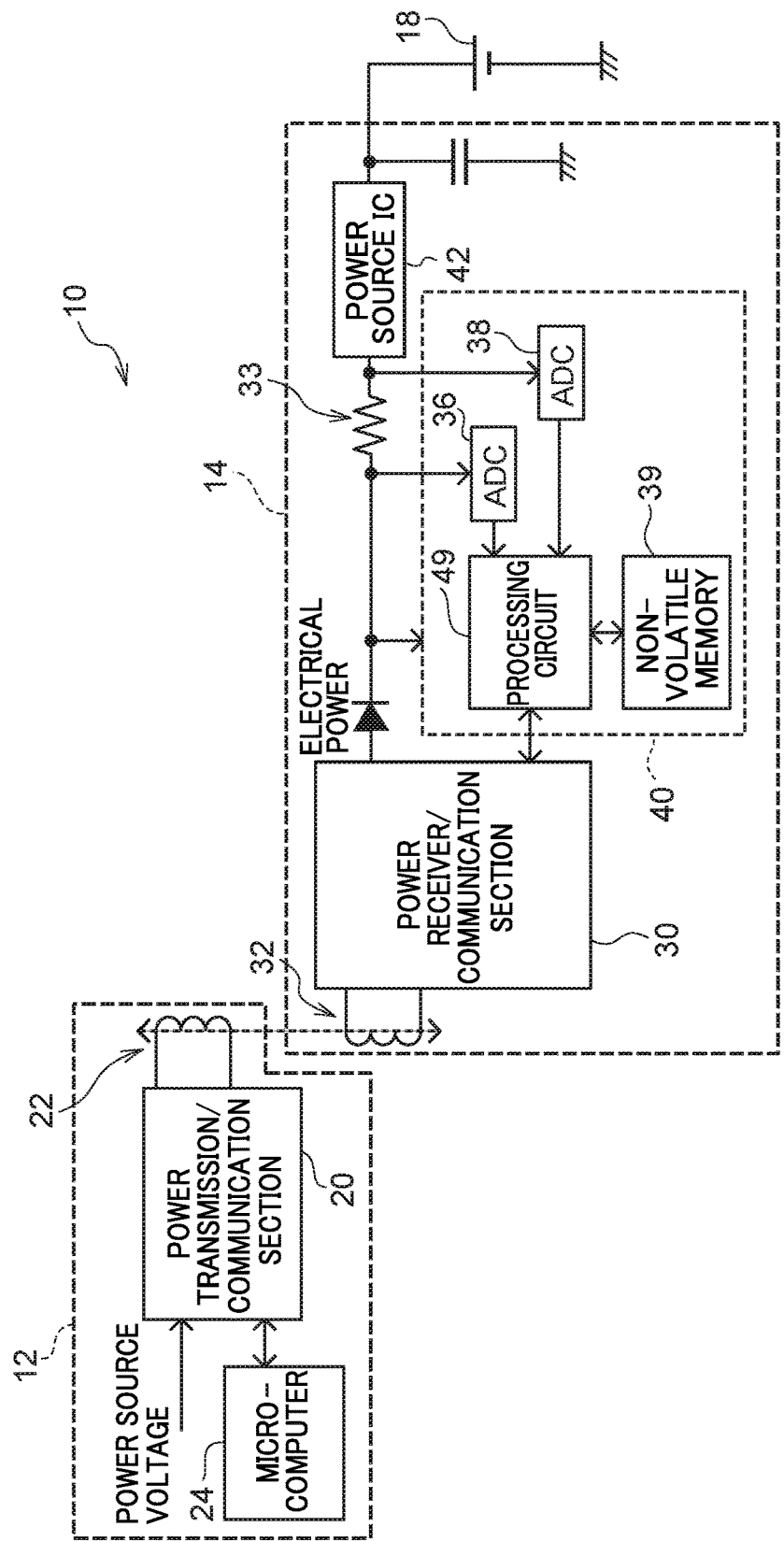
FIG. 6 is a diagram illustrating a schematic configuration of another example of a wireless power supply system of an exemplary embodiment.

Further, for example, the wireless power receiver 14 may have a configuration in which a processing circuit 49 that operates using hardware alone is provided, instead of the microcomputer 34, as in the example illustrated in FIG. 6. Namely, the processing circuit 49 may be configured as a circuit that operates using hardware only, rather than operating through a cooperation of hardware and software as in the microcomputer 34. This may enable the circuit scale to be reduced and may enable cost to be suppressed. Further, employing a dedicated processing circuit may enable electrical power consumption to be suppressed.

Further, in the present exemplary embodiment, a case in which the wireless power receiver 14 includes the ADC 36 and the ADC 38, has been described. However, the wireless power receiver 14 may include only one out of the ADC 36 or the ADC 38. Note that including both the ADC 36 and the ADC 38 in the wireless power receiver 14 enables electrical power to be detected.

Further, in the present exemplary embodiment, although a case in which the wireless power supply system 10 performs wireless power supply using an electromagnetic induction method, has been described, the method of wireless power supply is not limited thereto. For example, a magnetic resonance method, an electric field coupling method, a microwave method, or the like may be employed.

Further, in the present exemplary embodiment, a case in which the antennas employed for wireless communication and the antennas employed for wireless power supply are dual-purpose antennas (the coil antenna 22 and the coil antenna 32), has been described. However, present disclosure is not limited thereto. The antennas employed for wireless communication and the antennas employed for wireless power supply may be provided separately from each other.

Further, in the present exemplary embodiment, a case in which the voltage is monitored when data is being written to the non-volatile memory 39, has been described. However, present disclosure is not limited thereto. For example, electrical power or current may be monitored when writing data.

Further, in the present exemplary embodiment, a case in which the wireless power receiver 14 supplies the battery 18 with only the electrical power that had been transmitted from the wireless power transmitter 12, has been described. However, present disclosure is not limited thereto. In the wireless power supply system 10, the battery 18 may be supplied power from any another charging device or the like.

Further, other configuration and operation of the wireless power supply system 10, the wireless power transmitter 12, and the wireless power receiver 14 described in the present exemplary embodiments are merely examples, and modifications may be made depending on the circumstances without departing from the scope of the present disclosure.

What is claimed is:

1. A wireless power receiver comprising:
   a power receiver configured to receive electrical power that is wirelessly transmitted from a wireless power transmitter;
   a power reception-side communication section configured to wirelessly communicate with the wireless power transmitter;
   a storage section to which data received by the power reception-side communication section is written by using the electrical power received by the power transmitter; and
   a monitoring section configured to monitor the electrical power or a voltage that corresponds to the electrical power supplied to the storage section in a case in which the data is being written to the storage section, the monitoring section transmits write information, which indicates whether or not the data was correctly written to the storage section based on a monitoring result, from the power reception-side communication section to the wireless power transmitter information.

2. The wireless power receiver of claim 1, wherein the monitoring section stores in the storage section, a combination of information indicating whether or not data was correctly written to the storage section and predetermined information, as the write information, and the monitoring section transmits from the power reception-side communication section to the wireless power transmitter the write information read from the storage section.

3. The wireless power receiver of claim 1, wherein the monitoring section determines that the data was correctly written to the storage section in a case in which electrical power supplied to the storage section is equal to or greater than a predetermined electrical power, or in cases in which a voltage that corresponds to the electrical power supplied to the storage section is equal to or greater than a predetermined voltage.

4. The wireless power receiver of claim 1, wherein the monitoring section includes a comparator that outputs a comparison result of comparing a voltage according to electrical power supplied to the storage section with a predetermined voltage.

5. A wireless power supply system comprising a wireless power transmitter and a wireless power receiver, wherein:
   the wireless power receiver includes
       a power receiver configured to receive electrical power that is wirelessly transmitted from a wireless power transmitter,
       a power reception-side communication section configured to wirelessly communicate with the wireless power transmitter,
       a storage section to which data received by the power reception-side communication section is written by using the electrical power received by the power transmitter, and
       a monitoring section configured to monitor the electrical power or a voltage that corresponds to the electrical power supplied to the storage section in a case in which the data is being written to the storage section, to store, in the storage section, a combination of a monitoring result and predetermined information, as monitoring information, and to transmit the monitoring information that has been read from the storage section to the wireless power transmitter from the power reception-side communication section; and
   the wireless power transmitter includes
       a power transmission section configured to wirelessly transmit electrical power to the wireless power receiver,
       a transmission-side communication section configured to wirelessly perform communication with the wireless power receiver, and
       a controller configured to control transmission of the data from the transmission-side communication section, and to determine whether or not the data is correctly written to the storage section based on the monitoring result obtained from the monitoring information received by the transmission-side communication section.

6. A wireless power reception method comprising:
   wirelessly receiving electrical power transmitted from a wireless power transmitter;
   performing wireless communication with the wireless power transmitter;
   writing received data to a storage section using the received electrical power;
   monitoring electrical power or a voltage that corresponds to the electrical power supplied to the storage section in a case in which the received data is being written to the storage section; and
   transmitting a monitoring result to the wireless power transmitter.

* * * * *